United States Patent
Tkachev et al.

(10) Patent No.: US 10,714,489 B2
(45) Date of Patent: Jul. 14, 2020

(54) METHOD OF PROGRAMMING A SPLIT-GATE FLASH MEMORY CELL WITH ERASE GATE

(71) Applicant: Silicon Storage Technology, Inc., San Jose, CA (US)

(72) Inventors: Yuri Tkachev, Sunnyvale, CA (US); Alexander Kotov, San Jose, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/209,515

(22) Filed: Dec. 4, 2018

(65) Prior Publication Data
US 2020/0066738 A1 Feb. 27, 2020

Related U.S. Application Data

(60) Provisional application No. 62/722,107, filed on Aug. 23, 2018.

(51) Int. Cl.
*H01L 29/788* (2006.01)
*H01L 27/11521* (2017.01)
*G11C 16/04* (2006.01)

(52) U.S. Cl.
CPC .... *H01L 27/11521* (2013.01); *G11C 16/0408* (2013.01); *H01L 29/7885* (2013.01)

(58) Field of Classification Search
CPC .............. H01L 27/11521; H01L 29/7885

USPC .................................................. 257/315, 321
See application file for complete search history.

(56) References Cited

U.S. PATENT DOCUMENTS

| | | |
|---|---|---|
| 5,029,130 A | 7/1991 | Yeh |
| 5,386,132 A | 1/1995 | Wong |
| 5,859,454 A | 1/1999 | Choi et al. |
| 6,747,310 B2 | 6/2004 | Fan |
| 7,868,375 B2 | 1/2011 | Liu et al. |
| 8,576,648 B2 | 11/2013 | Markov et al. |
| 8,711,636 B2 | 4/2014 | Do et al. |
| 2017/0110194 A1* | 4/2017 | Tiwari ................. G11C 16/12 |

* cited by examiner

*Primary Examiner* — Tan N Tran
(74) *Attorney, Agent, or Firm* — DLA Piper LLP (US)

(57) ABSTRACT

A memory device with a memory cell and control circuitry. The memory cell includes source and drain regions formed in a semiconductor substrate, with a channel region extending there between. A floating gate is disposed over a first portion of the channel region for controlling its conductivity. A select gate is disposed over a second portion of the channel region for controlling its conductivity. A control gate is disposed over the floating gate. An erase gate is disposed over the source region and adjacent to the floating gate. The control circuitry is configured to perform a program operation by applying a negative voltage to the erase gate for causing electrons to tunnel from the erase gate to the floating gate, and perform an erase operation by applying a positive voltage to the erase gate for causing electrons to tunnel from the floating gate to the erase gate.

18 Claims, 6 Drawing Sheets

METHOD OF PROGRAMMING A SPLIT-GATE FLASH MEMORY CELL WITH ERASE GATE

This application claims the benefit of U.S. Provisional Application No. 62/722,107, filed on Aug. 23, 2018, and which is incorporated herein by reference.

FIELD OF THE INVENTION

The present invention relates to non-volatile memory arrays.

BACKGROUND OF THE INVENTION

Figure 1:
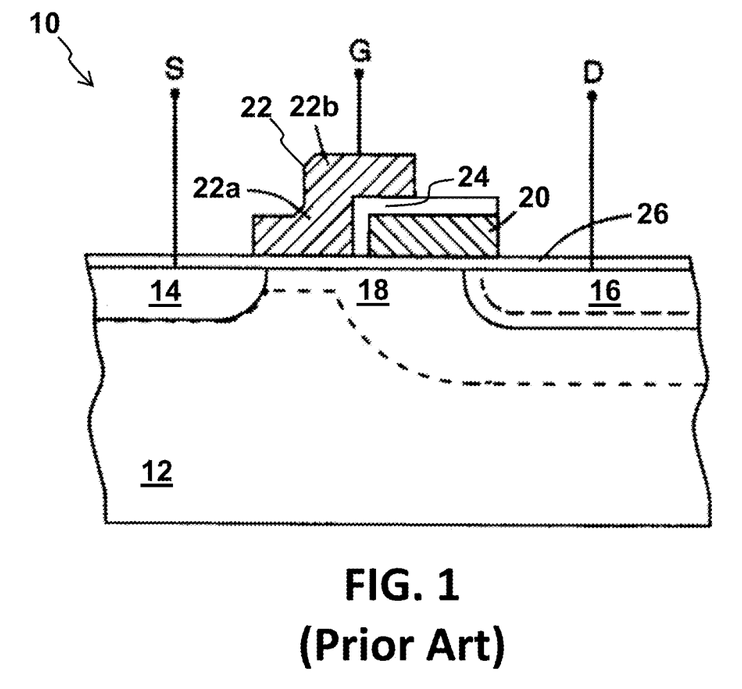
FIG. 1 is a cross sectional view of a first embodiment of a conventional two-gate memory cell.

Split gate non-volatile memory cells, and arrays of such cells, are well known. For example, U.S. Pat. No. 5,029,130 ("the '130 patent") discloses an array of split gate non-volatile memory cells, and is incorporated herein by reference for all purposes. The memory cell is shown in FIG. 1. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 has a first portion 22a that is disposed over and insulated from (and controls the conductivity of) a second portion of the channel region 18, and a second portion 22b that extends up and over the floating gate 20. The floating gate 20 and control gate 22 are insulated from the substrate 12 by a gate oxide 26. The memory cell is referred to as split gate, because two different gates (floating gate 20 and control gate 22) separately control the conductivity of two different portions of the same channel region 18. Therefore, the channel region 18 can conduct current between the source and drain regions 14/16 only if both of its portions are turned on by the floating and control gates 20/22.

The memory cell is erased (where electrons are removed from the floating gate) by placing a high positive voltage on the control gate 22, which causes electrons on the floating gate 20 to tunnel through the intermediate insulation 24 from the floating gate 20 to the control gate 22 via the well-known technique of Fowler-Nordheim tunneling. Tunneling of electrons from one conductive gate to another conductive gate through intervening insulation is well known and not further described.

The memory cell is programmed (where electrons are placed on the floating gate 20) by placing a positive voltage on the control gate 22, and a positive voltage on the drain 16. The portion of the channel region 18 under the control gate 22 is turned on (made conductive) by the positive voltage on the control gate 22. The portion of the channel region 18 under the floating gate 20 is turned on (made conductive) by the positive voltages on the control gate 22 and drain region 16 being capacitively coupled to the floating gate 20. Electron current will flow starting from the source 14 towards the drain 16 in the portion of the channel region 18 under the control gate 22. The electrons will accelerate and become heated when they reach the gap between the control gate 22 and the floating gate 20. Some of the heated electrons will be injected through the gate oxide 26 and onto the floating gate 20 due to the attractive electrostatic force from the floating gate 20. This programming technique is well known as hot-electron injection, and is commonly used especially for split gate memory cells.

Figure 2:
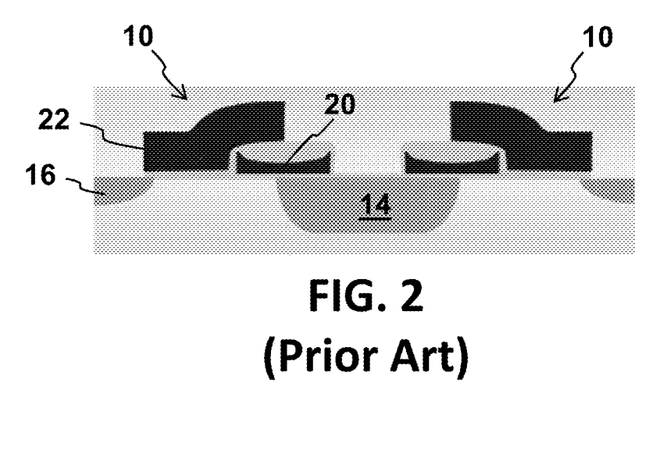
FIG. 2 is a cross sectional view of a second embodiment of a conventional two-gate memory cell.

The memory cell 10 is read by placing positive read voltages on the drain region 16 and control gate 22 (which turns on the portion of channel region 18 under the control gate 22). If the floating gate 20 is positively charged (i.e. erased of electrons), then the portion of the channel region under the floating gate 20 is turned on as well (because of the capacitive coupling of the positive voltages to the floating gate 20), and current will flow across the channel region 18, which is sensed as the erased or "1" state. If the floating gate 20 is negatively charged (i.e. programmed with electrons), then the portion of the channel region under the floating gate 20 is mostly or entirely turned off (because the capacitive coupling of the positive voltages cannot overcome the negative charge on the floating gate 20), and current will not flow (or there will be little flow) across the channel region 18, which is sensed as the programmed or "0" state. Those skilled in the art understand that the terms source and drain can be interchangeable, where the floating gate 20 can extend partially over the source 14 instead of the drain 16, as shown in FIG. 2.

Figure 3:
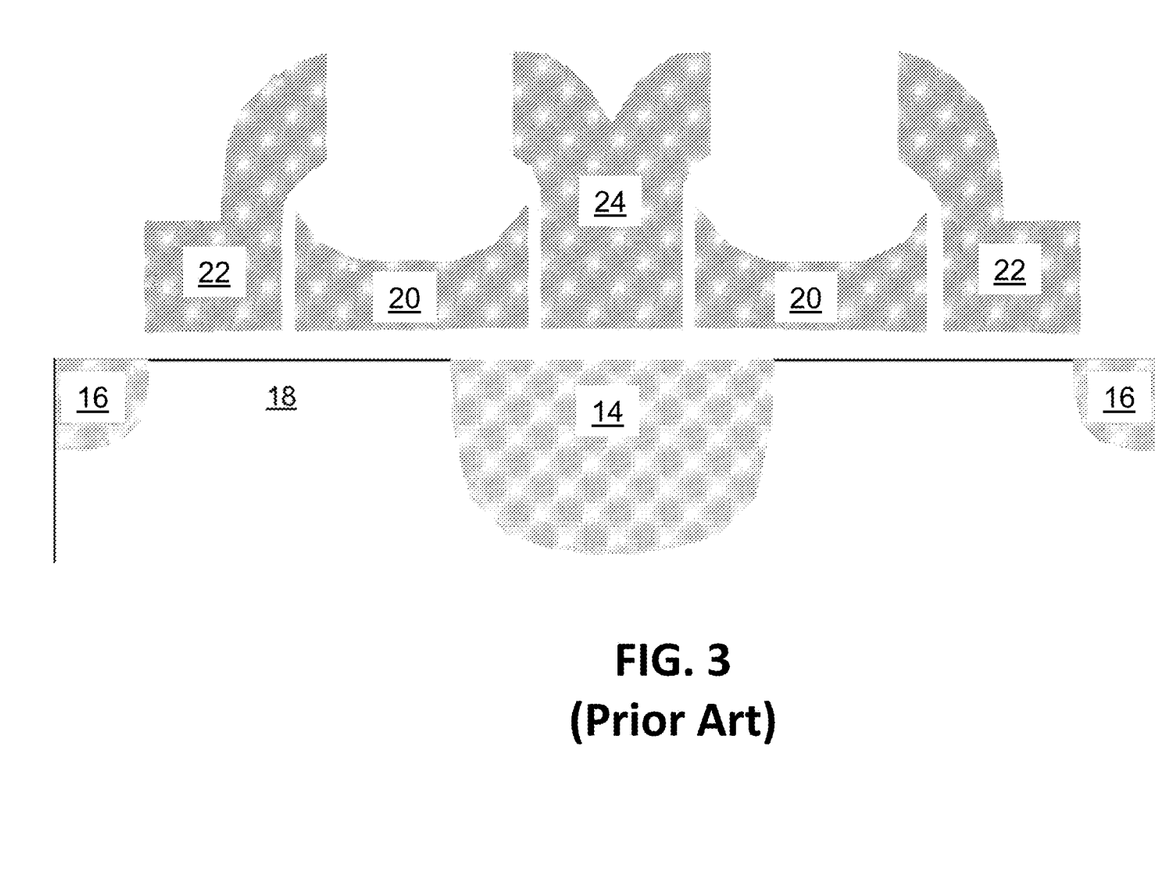
FIG. 3 is a cross sectional view of a conventional three-gate memory cell.

Split gate memory cells having more than two gates are also known. For example, U.S. Pat. No. 8,711,636 ("the '636 patent"), incorporated herein by reference, discloses a split gate memory cell with an additional coupling gate disposed over and insulated from the source region, for better capacitive coupling to the floating gate. See for example FIG. 3 showing a split gate memory cell with a coupling gate 24 disposed over source region 14.

Figure 4:
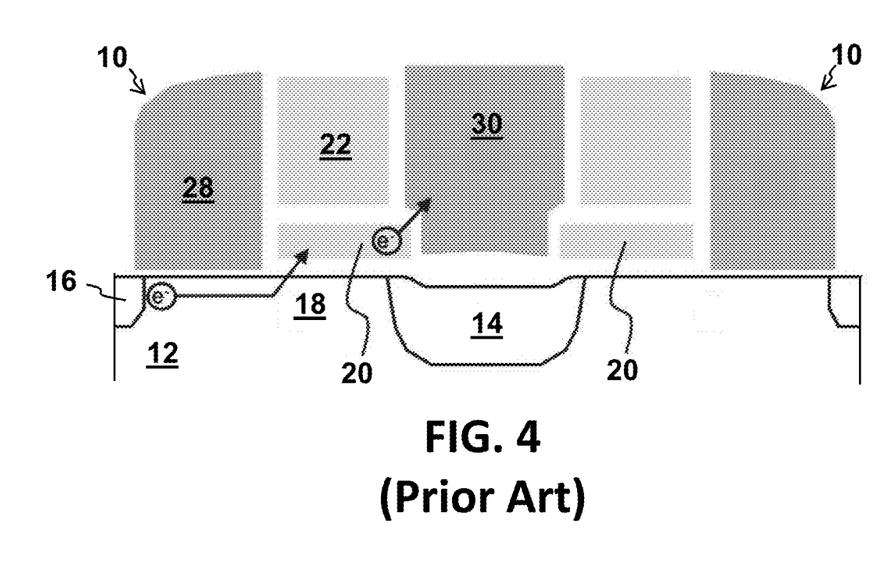
FIG. 4 is a cross sectional view of a conventional four-gate memory cell.

A split gate memory cell having four gates is disclosed in U.S. Pat. Nos. 6,747,310 and 7,868,375, which are incorporated herein by reference. For example, as shown in FIG. 4, the four gate memory cell 10 has a source region 14, a drain region 16, a floating gate 20 over a first portion of channel region 18, a select gate 28 over a second portion of the channel region 18 (also referred to as the word line gate), a control gate 22 over the floating gate 20, and an erase gate 30 over the source region 14. Erasing is shown in FIG. 4 by electrons tunneling from the floating gate 20 to the erase gate 30 by placing a high positive voltage on the erase gate 30. Programming is shown in FIG. 4 by heated electrons from the channel region 18 injecting themselves onto the floating gate 20 by hot-electron injection. Below in Table 1 are exemplary voltages and current that can be used to program the memory cells:

TABLE 1

|  | SG 28 | Drain 16 | Source 14 | EG 30 | CG 22 |
| --- | --- | --- | --- | --- | --- |
| Program | 1 V | ~1 µA | 4.5 V | 4.5 V | 10.5 V |

One issue with hot-electron injection programming is that it requires a significant amount of electrical current for each memory cell to implement. However, programming is often byte-by-byte, which means the memory device must include voltage and current sources sufficiently large enough to provide the necessary voltages and currents for concurrent programming of multiple memory cells. Mass programming using one or more internal charge pumps is difficult because of the high programming current requirements of hot-electron injection. Some parallelization in programming can be achieved using external voltage source(s). However, mass programming is simply not effective for most applications given the high current required, in additional to other factors such as the source line voltage drop. Another issue with hot-electron injection programming is that it takes a relatively long time to complete, given that only some of the electrons traveling from the drain region 16 to the source region 14 end up being injected onto the floating gate 20. The rest complete their journey to the source region 14 without being injected onto the floating gate 20. Therefore, its efficiency in that respect is relatively low.

There is a need for a more efficient technique of programming split gate memory cells having four gates.

BRIEF SUMMARY OF THE INVENTION

The aforementioned problems and needs are addressed by a memory device that includes a semiconductor substrate, a memory cell and control circuitry. The memory cell includes a source region and a drain region formed in the substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The control circuitry is configured to perform a program operation by applying a negative voltage to the erase gate for causing electrons to tunnel from the erase gate to the floating gate, and perform an erase operation by applying a positive voltage to the erase gate for causing electrons to tunnel from the floating gate to the erase gate.

A method of operating a memory device having a memory cell that includes a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The method includes performing a program operation by applying a negative voltage to the erase gate to cause electrons to tunnel from the erase gate to the floating gate, and performing an erase operation by applying a positive voltage to the erase gate to cause electrons to tunnel from the floating gate to the erase gate.

Other objects and features of the present invention will become apparent by a review of the specification, claims and appended figures.

DETAILED DESCRIPTION OF THE INVENTION

Figure 5:
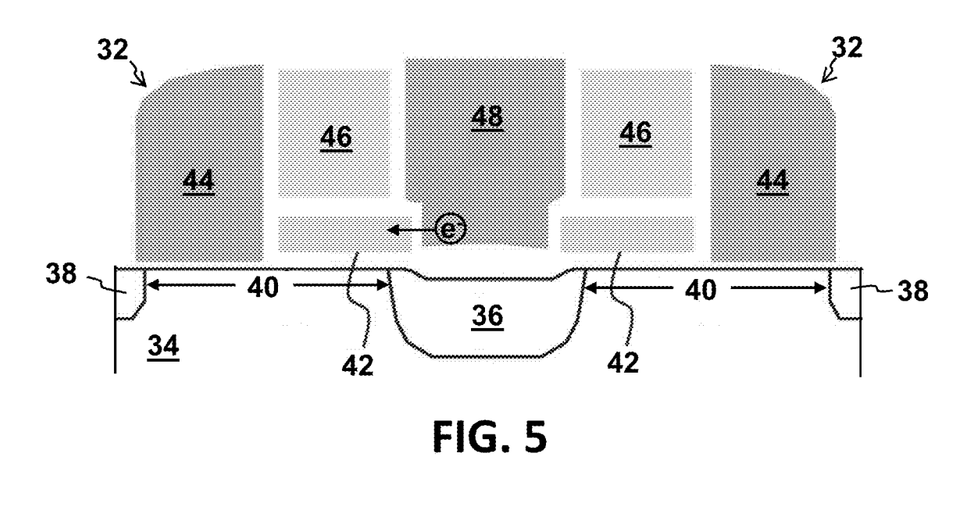
FIG. 5 is a cross sectional view of a four-gate memory cell utilizing erase gate programming.

The present invention involves a new technique for programming split gate memory cells having four gates. Specifically, a memory cell 32 is shown in FIG. 5, and includes a source region 36 and a drain region 38 formed in a semiconductor substrate 34, with a channel region 40 of the substrate 34 extending between the source and drain regions 36/38. A floating gate 42 is disposed over and insulated from a first portion of channel region 40. A select gate 44 (also referred to as the word line gate) is disposed over and insulated from a second portion of the channel region 40. A control gate 46 is disposed over and insulated from the floating gate 42. An erase gate 48 is disposed over and insulated from the source region 36, and disposed adjacent to and insulated from the floating gate 42. The memory cell 32 is a split gate memory cell because two different gates (floating gate 42 and select gate 44) separately control the conductivity of two different portions of the same channel region 40. The memory cells are preferably formed in pairs, where two adjacent memory cells share the same erase gate 48 and source region 36, as shown in FIG. 5. Two adjacent memory cell pairs can share the same drain region 38.

Table 2 below illustrates the voltages applied to program the floating gate 42 with electrons.

TABLE 2

| | SG 44 | Drain 38 | Source 36 | EG 48 | CG 46 |
|---|---|---|---|---|---|
| Program | 0 V | 0 V | 0 V | −11 V to −13 V | 0 V |

By applying a negative voltage of sufficient magnitude to the erase gate 48, with a zero voltage (i.e., ground) applied to the remaining elements (select gate 44, drain region 38, source region 36 and control gate 46), electrons will tunnel from the erase gate 48 to the floating gate 42, as graphically shown in FIG. 5.

The programming of the floating gate 42 using the erase gate 48 is highly efficient, as virtually all of the electrons in the electrical current generated by the negative voltage on the erase gate 48 will reach the floating gate 42. Therefore, the electrical current needed to program the split gate memory cell using this erase gate programming technique is much lower than is needed using the hot-electron injection technique. This allows for more split gate memory cells to be programmed simultaneously without requiring larger and more powerful voltage and current sources that would otherwise be required, thus reducing the cost and size of the memory device. This programming technique is also faster than the prior art hot-electron injection programming technique of programming split gate memory cells. It is also ideal for those applications for which deep programming of the floating gate 42 of the split gate memory cell 32 is desired (i.e., placing a relatively high number of electrons on the floating gate 42).

Memory cell 32 is erased as described above, namely, applying a sufficiently high positive voltage on the erase gate 48, such as positive 10-12 volts, causing electrons on the floating gate 42 to tunnel through the intervening insulation and onto the erase gate 48. Preferably, a zero voltage is applied to the select gate 44, drain region 38, source region 36 and control gate 46 during the erase operation. Alternately, a lower positive voltage can be used on the erase gate 48 to induce such erase tunneling if a negative voltage is also applied to the control gate 46 during the erase operation. For example, a voltage of positive 6-8 volts on the erase gate 48 and a negative voltage of −6 to −8 volts on the control gate 46 can be used to erase the floating gate 42.

Table 3 below illustrates the voltages applied to program the floating gate 42 with electrons in an alternate embodiment. Specifically, a positive voltage is applied to the control gate 46 simultaneously with the negative voltage on the erase gate 48.

TABLE 3

|  | SG 44 | Drain 38 | Source 36 | EG 48 | CG 46 |
|---|---|---|---|---|---|
| Program | 0 V | 0 V | 0 V | −7 V to −9 V | 7 V to 9 V |

The positive voltage on the control gate 46 couples to the floating gate 42, thereby better attracting the electrons on the erase gate 48 to tunnel to the floating gate 42. By applying a positive voltage on the control gate 46, the magnitude of the negative voltage on the erase gate 48 can be reduced, thereby further reducing the size and cost of the negative voltage source used by the device.

Figure 6:
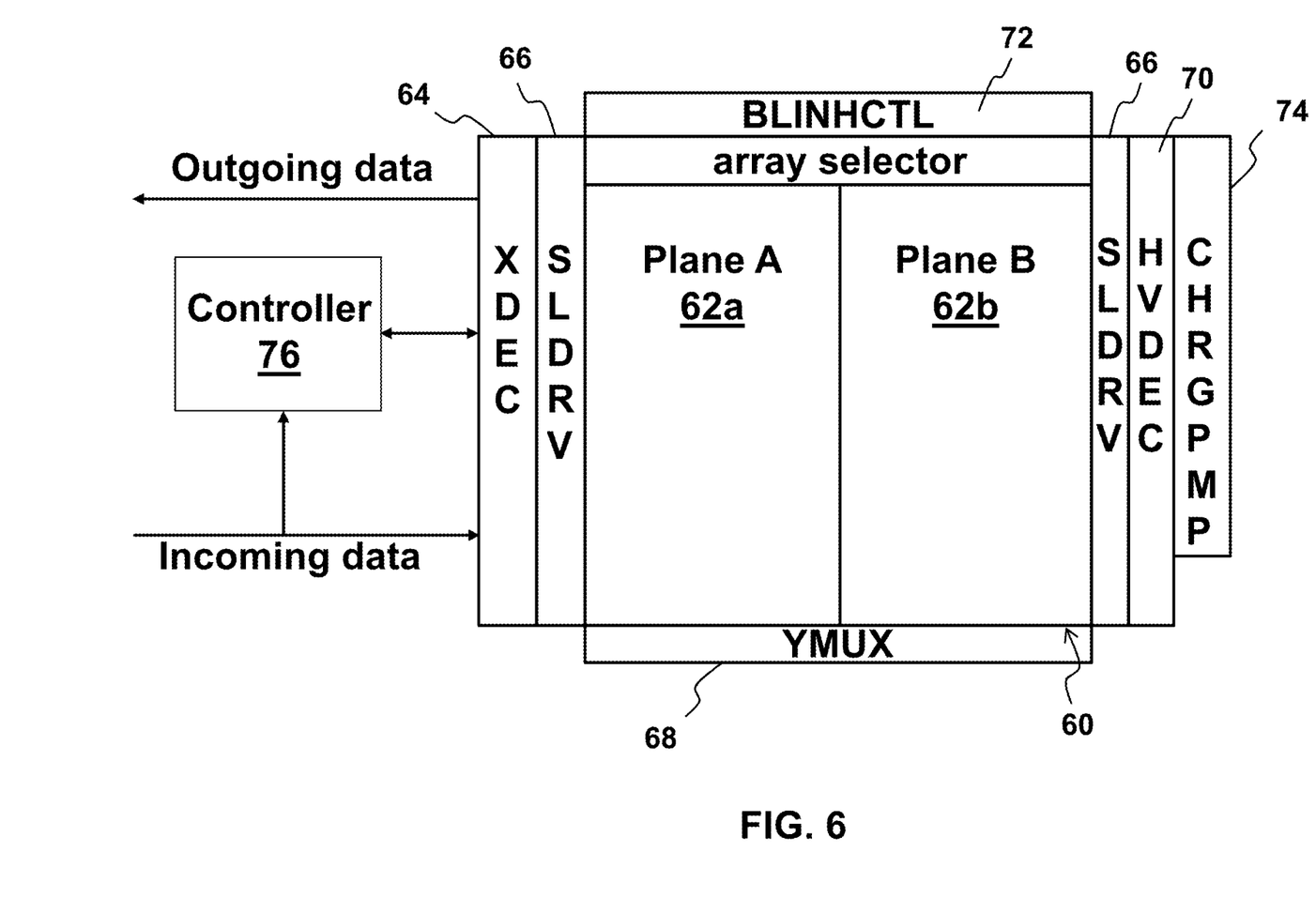
FIG. 6 is a plan view showing the architecture of an exemplary memory device of the present invention.

The architecture of an exemplary memory device with the memory cells 32 is illustrated in FIG. 6. The memory device includes an array 60 of the non-volatile memory cells 32, which can be segregated into two separate planes (Plane A 62a and Plane B 62b). The memory cells 32 are preferably formed on a single chip, arranged in a plurality of rows and columns in the semiconductor substrate 34. Adjacent to the array of non-volatile memory cells are address decoders (e.g. XDEC 64 (a row decoder that drives the word lines), SLDRV 66 (a source line driver for driving the source lines), YMUX 68 (a column decoder that drives the bit lines), HVDEC 70 (a high voltage decoder) and a bit line controller (BLINHCTL 72), which are used to decode addresses and supply the various voltages to the various memory cell gates and regions during read, program, and erase operations for selected memory cells. Controller 76 (containing control circuitry) controls the various device elements to implement each operation (program, erase, read) on target memory cells 32 (i.e., to directly or indirectly provide the voltages and currents to operate the memory cells 32, including the voltages used to program the floating gate 42 using the erase gate negative voltage discussed above). Charge pump CHRGPMP 74 provides the various voltages used to read, program and erase the memory cells under the control of the controller 76.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory device of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
   a semiconductor substrate;
   a memory cell that includes:
      a source region and a drain region formed in the substrate, with a channel region of the substrate extending between the source and drain regions,
      a floating gate disposed over and insulated from a first portion of the channel region, for controlling a conductivity of the first portion of the channel region,
      a select gate disposed over and insulated from a second portion of the channel region, for controlling a conductivity of a second portion of the channel region,
      a control gate disposed over and insulated from the floating gate, and
      an erase gate disposed over and insulated from the source region, and disposed adjacent to and insulated from the floating gate; and
   a control circuitry configured to:
      perform a program operation by applying a negative voltage to the erase gate for causing electrons to tunnel from the erase gate to the floating gate, and
      perform an erase operation by applying a positive voltage to the erase gate for causing electrons to tunnel from the floating gate to the erase gate.

2. The memory device of claim 1, wherein the control circuitry is further configured to apply a zero voltage to the control gate while the negative voltage is applied to the erase gate.

3. The memory device of claim 2, wherein the control circuitry is further configured to apply a zero voltage to each of the select gate, the source region and the drain region while the negative voltage is applied to the erase gate.

4. The memory device of claim 1, wherein the control circuitry is further configured to apply a positive voltage to the control gate while the negative voltage is applied to the erase gate.

5. The memory device of claim 4, wherein the control circuitry is further configured to apply a zero voltage to each of the select gate, the source region and the drain region while the negative voltage is applied to the erase gate.

6. The memory device of claim 1, wherein the control circuitry is further configured to apply a zero voltage to the control gate while the positive voltage is applied to the erase gate.

7. The memory device of claim 6, wherein the control circuitry is further configured to apply a zero voltage to each of the select gate, the source region and the drain region while the positive voltage is applied to the erase gate.

8. The memory device of claim 1, wherein the control circuitry is further configured to apply a negative voltage to the control gate while the positive voltage is applied to the erase gate.

9. The memory device of claim 8, wherein the control circuitry is further configured to apply a zero voltage to each of the select gate, the source region and the drain region while the positive voltage is applied to the erase gate.

10. A method of operating a memory device that comprises a memory cell having:
    a source region and a drain region formed in a semiconductor substrate, with a channel region of the substrate extending between the source and drain regions,
    a floating gate disposed over and insulated from a first portion of the channel region, for controlling a conductivity of the first portion of the channel region,
    a select gate disposed over and insulated from a second portion of the channel region, for controlling a conductivity of a second portion of the channel region,
    a control gate disposed over and insulated from the floating gate, and
    an erase gate disposed over and insulated from the source region, and disposed adjacent to and insulated from the floating gate;
    the method comprising:
    performing a program operation by applying a negative voltage to the erase gate to cause electrons to tunnel from the erase gate to the floating gate, and
    performing an erase operation by applying a positive voltage to the erase gate to cause electrons to tunnel from the floating gate to the erase gate.

11. The method of claim 10, further comprising:
applying a zero voltage to the control gate while the negative voltage is applied to the erase gate.

12. The method of claim 11, further comprising:
applying a zero voltage to each of the select gate, the source region and the drain region while the negative voltage is applied to the erase gate.

13. The method of claim 10, further comprising:
applying a positive voltage to the control gate while the negative voltage is applied to the erase gate.

14. The method of claim 13, further comprising:
applying a zero voltage to each of the select gate, the source region and the drain region while the negative voltage is applied to the erase gate.

15. The method of claim 10, further comprising
applying a zero voltage to the control gate while the positive voltage is applied to the erase gate.

16. The method of claim 15, further comprising
applying a zero voltage to each of the select gate, the source region and the drain region while the positive voltage is applied to the erase gate.

17. The method of claim 10, further comprising
applying a negative voltage to the control gate while the positive voltage is applied to the erase gate.

18. The method of claim 17, further comprising
applying a zero voltage to each of the select gate, the source region and the drain region while the positive voltage is applied to the erase gate.

* * * * *